(12) United States Patent
Holz et al.

(10) Patent No.: US 7,528,453 B2
(45) Date of Patent: May 5, 2009

(54) FIELD EFFECT TRANSISTOR WITH LOCAL SOURCE/DRAIN INSULATION AND ASSOCIATED METHOD OF PRODUCTION

(75) Inventors: Jürgen Holz, Dresden (DE); Klaus Schrüfer, Baldham (DE); Helmut Tews, Müchen (DE)

(73) Assignee: Infineon Technologies AG, Munich (DE)

( * ) Notice: Subject to any disclaimer, the term of this patent is extended or adjusted under 35 U.S.C. 154(b) by 101 days.

(21) Appl. No.: 10/530,634

(22) PCT Filed: Sep. 19, 2003

(86) PCT No.: PCT/DE03/03130

§ 371 (c)(1),
(2), (4) Date: Apr. 7, 2005

(87) PCT Pub. No.: WO2004/034458

PCT Pub. Date: Apr. 22, 2004

(65) Prior Publication Data

US 2005/0280052 A1  Dec. 22, 2005

(30) Foreign Application Priority Data

Oct. 7, 2002  (DE) .............................. 102 46 718

(51) Int. Cl.
*H01L 27/088* (2006.01)
(52) U.S. Cl. .................. 257/396; 257/397; 257/374; 257/386; 257/E29.021; 257/E29.039
(58) Field of Classification Search ............. 257/372, 257/373, 374, 386, 396, 397, E29.02, E29.021, 257/E29.039, E29.12, E29.121, E29.122
See application file for complete search history.

(56) References Cited

U.S. PATENT DOCUMENTS 5,043,778 A  8/1991  Teng et al.

(Continued)

FOREIGN PATENT DOCUMENTS

DE  197 49 378 A1  5/1999

(Continued)

OTHER PUBLICATIONS

Norbert Elbel, Zvonimir Gabric, Wolfram Langheinrich and Bernard Neureither, *A New STI Process Based on Selective Oxide Deposition*, pp. 208-209, Symposium on VLSI Technology Digest of Technical Papers, IEEE, 1998.

(Continued)

*Primary Examiner*—Evan Pert
*Assistant Examiner*—Leslie Pilar Cruz
(74) *Attorney, Agent, or Firm*—Brinks Hofer Gilson & Lione

(57) ABSTRACT

A field-effect transistor (FET) with local source-drain insulation is described. The FET includes a semiconductor substrate, source and drain depressions, a depression insulation layer, an electrically conductive filling layer, a gate dielectric, and a gate layer. The depression insulation layer is formed at least in bottom regions of the source and drain depressions. The electrically conductive filling layer realizes source and drain regions and fills the source and drain depressions at a surface of the depression insulation layer. The gate dielectric is formed at a substrate surface between the source and drain depressions. The gate layer (is formed at a surface of the gate dielectric. The source and drain depressions have, in an upper region, a widening with a predetermined death for realizing defined channel connection regions.

7 Claims, 5 Drawing Sheets

U.S. PATENT DOCUMENTS

| | | | |
|---|---|---|---|
| 5,620,912 | A | 4/1997 | Hwang et al. |
| 5,908,313 | A * | 6/1999 | Chau et al. .................. 438/299 |
| 5,943,575 | A * | 8/1999 | Chung ........................ 438/300 |
| 5,949,116 | A | 9/1999 | Wen |
| 6,346,729 | B1 | 2/2002 | Liang et al. |
| 6,399,973 | B1 * | 6/2002 | Roberds .................... 257/288 |
| 6,403,482 | B1 | 6/2002 | Rovedo et al. |
| 2001/0017387 | A1 | 8/2001 | Hsieh et al. |
| 2001/0025998 | A1 * | 10/2001 | Tsuchiaki .................. 257/402 |
| 2002/0142552 | A1 | 10/2002 | Wu |
| 2002/0190284 | A1 * | 12/2002 | Murthy et al. .............. 257/286 |
| 2003/0080361 | A1 * | 5/2003 | Murthy et al. .............. 257/288 |
| 2003/0107052 | A1 * | 6/2003 | Chan et al. ................. 257/200 |
| 2003/0234422 | A1 * | 12/2003 | Wang et al. ................. 257/336 |

FOREIGN PATENT DOCUMENTS

| | | |
|---|---|---|
| DE | 198 12 643 C1 | 7/1999 |
| JP | 60161669 A * | 8/1985 |
| JP | 62-143472 | 6/1987 |
| JP | 01-268061 | 10/1989 |
| JP | 11-008379 | 1/1999 |
| JP | 2002-016246 | 1/2002 |
| WO | WO 01/50535 A2 | 7/2001 |
| WO | WO 02/43109 A2 | 3/2002 |

OTHER PUBLICATIONS

N.G. Anantha, C.T. Horng, R.R. Konian and R.E. Matick, *Self-Aligned Igfet With Silicon Dioxide Isolated Source and Drain*, pp. 4895-4899, IBM Technical Disclosure Bulletin, vol. 22, No. 11, Apr. 1980.

International Search Report from corresponding PCT patent application No. PCT/DE03/03130.

Examination Report from corresponding PCT patent application No. PCT/DE03/03130.

* cited by examiner

FIELD EFFECT TRANSISTOR WITH LOCAL SOURCE/DRAIN INSULATION AND ASSOCIATED METHOD OF PRODUCTION

This application is the national stage application of international application number PCT/DE03/003130, filed on Sept. 19, 2003, which claims the benefit of priority to German Patent Application 102 46 718.8, filed on Oct. 7, 2002, herein incorporated herein by reference.

The present invention relates to a field-effect transistor with local source/drain insulation and to an associated fabrication method and, in particular, to a field-effect transistor with structures in the sub-100 nm range, which can be used in so-called mixed-signal circuits.

The electrical properties of field-effect transistors are influenced by a multiplicity of parameters, so-called junction capacitances, in particular, bringing about undesirable parasitic effects in the field-effect transistor. Such junction capacitances are caused in particular at the pn junctions of the source and drain regions in the semiconductor substrate since relatively high parasitic capacitances arise at this location on account of space charge or depletion zones.

In order to avoid or decrease such junction capacitances, so-called SOI substrates (silicon on insulator) have conventionally been used, whereby at least a lower region of respective source and drain regions has been directly bounded by the insulation region of the SOI substrate or wafer. What are disadvantageous about such semiconductor circuits in an SOI substrate, however, are the significantly increased costs and also the associated disadvantages in so-called mixed-signal circuits. While a fully depleted channel region is often even desirable in short-channel field-effect transistors, field-effect transistors with long channel regions require a connection possibility in order to prevent these regions from being charged and in order to realize the highest possible linearity of the characteristic curves. In the same way, a connection possibility for the channel region is also of importance for the so-called matching behavior of the transistors, in order, by way of example, to enable an identical behavior of two identical transistors in a semiconductor circuit. Therefore, for mixed-signal circuits, in particular, the use of SOI substrates yields only inadequate results. Furthermore, SOI substrates have only a poor thermal linking of the active regions.

The document JP 021 280 430 A discloses a method for fabricating a field-effect transistor, in which case, for producing local source/drain insulations, an oxygen implantation is carried out in such a way that oxygen ions are implanted directly below the source and drain regions in the semiconductor substrate and are subsequently converted into a buried silicon dioxide layer. What are disadvantageous in this case, however, are the relatively inaccurate formation of these buried insulation regions, such as, for example, an unsharp lateral transition between implanted and non-implanted region, and, in particular, a lack of applicability of such methods to field-effect transistors with structures in the sub-100 nm range.

Therefore, the invention is based on the object of providing a field-effect transistor with local source/drain insulation and an associated fabrication method, it being possible to reduce junction capacitances in a particularly simple manner.

In particular through the use of a source depression and a drain depression, which have a depression insulation layer at least in a bottom region, and an electrically conductive filling layer, which is formed for realizing source and drain regions and for filling the depressions at the surface of the depression insulation layer, a field-effect transistor with reduced junction capacitances is obtained which can be realized simply and cost-effectively both for mixed-signal circuits and for feature sizes of less than 100 nm.

Besides the depression bottom insulation layer, the depression insulation layer may also have a depression sidewall insulation layer, which, however, does not touch the gate dielectric, thus resulting in further reduced junction capacitances and shallow or accurately defined extension or connection regions for the channel region.

In order to realize highly accurately defined channel connection regions, the source and drain depressions may have a predetermined width in the upper region with a predetermined depth. In this way, the desired shallow connection regions for the channel regions can be realized very precisely and the very shallow implantations that are usually employed, the problems due to diffusion-promoting effects of defects and also very short RTP annealing steps (rapid thermal process) with their poor reproducibility or a pre-amorphization and defect implantations are obviated. However, on account of the depression sidewall insulation layers, it is possible to significantly reduce the high leakage currents and junction capacitances that usually occur in this region.

In order to improve a deposition process in the source and drain depressions, the electrically conductive filling layer may have a seed layer, as a result of which even very narrow and deep source and drain depressions or holes can be filled sufficiently well.

Furthermore, the depression sidewall insulation layer may also extend into a region below the gate dielectric or below the channel region. What can thereby be achieved is that short-channel transistors are insulated from the substrate and long-channel transistors on the same wafer acquire a possibility of connection to the substrate. Thus, the optimal devices are produced both for digital circuits and for mixed-signal circuits. This is particularly advantageous for an SoC (system on chip) integration.

The invention is described in more detail below using exemplary embodiments with reference to the drawing.

Figure 1:
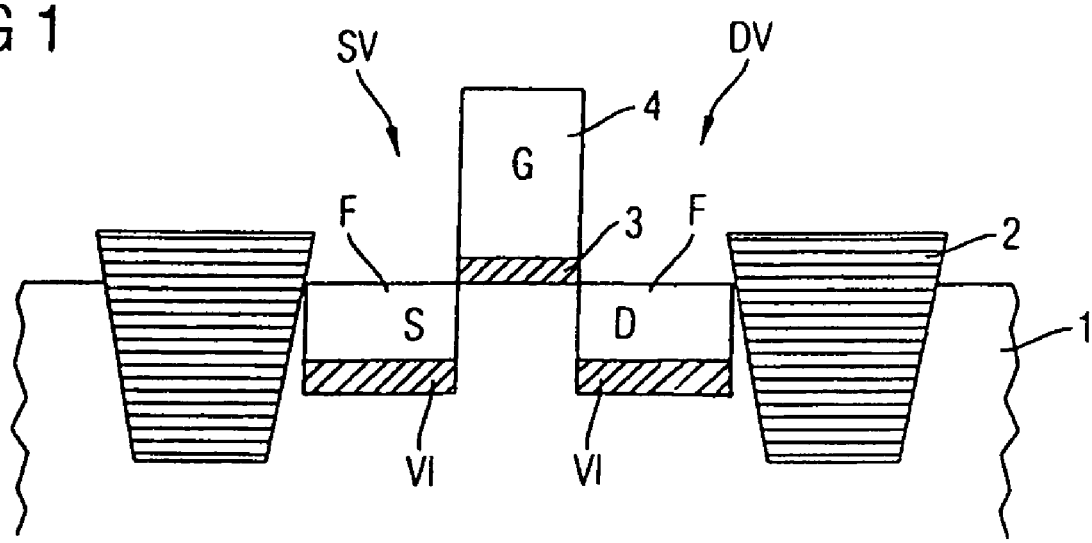
FIG. 1 shows a simplified sectional view of a field-effect transistor with local source/drain insulation in accordance with a first exemplary embodiment.

FIG. 1 shows a simplified sectional view of a field-effect transistor with local source/drain insulation in accordance with a first exemplary embodiment, in which case, in a semiconductor substrate 1, which is preferably composed of a silicon semiconductor material, active regions are formed by means of an STI method (shallow trench isolation) for forming shallow trench isolations 2. Said shallow trench isolations 2 may be embodied for example in strip form in the semiconductor substrate 1, thus resulting in strip-type active regions situated in between.

In this case, the field-effect transistor has a gate stack G formed at the surface of the semiconductor substrate 1, which gate stack essentially has a gate dielectric such as e.g. a gate oxide layer 3 and also an actual gate or control layer 4. At the sides of the gate stack G, a source depression SV and a drain depression DV are then formed in a manner spaced apart from one another in the semiconductor substrate 1, a region which lies below the gate dielectric 3 representing a channel region. In this case, the depressions formed may be cutouts, holes, trenches, etc. with a corresponding depth in the semiconductor substrate 1.

In accordance with FIG. 1, a depression insulation layer VI is in each case formed in a bottom region of the source depression SV and of the drain depression DV, which layer represents a local source and drain insulation with respect to the semiconductor substrate 1 and thus significantly reduces a junction capacitance of a respective source and drain region. In contrast to conventional depression insulation layers formed by means of oxygen implantations, the local source and drain insulations according to the invention are formed in narrowly delimited fashion and very exactly in the depression. Furthermore, the field-effect transistor has an electrically conductive filling layer F for realizing the actual source and drain regions S and D, the filling layer F being formed at the surface of the depression insulation layer and filling the source and drain depressions SV and DV.

This results in a field-effect transistor with local source and drain insulation which has a significantly reduced junction capacitance at its source and drain regions S and D and furthermore enables a connection possibility for the channel region lying between the source and drain regions. In this way, field-effect transistors with long channels and high linearity and also outstanding matching properties can also be realized in particular in mixed-signal circuits. Furthermore, such a local source and drain insulation also results in a thermal linking of the channel regions to the semiconductor substrate 1 which is greatly improved in comparison with SOI substrates. Particularly in the case of field-effect transistors with lateral structures in the sub-100 nm range or <100 nm, it is thus possible to fabricate field-effect transistors with further improved electrical properties in a relatively simple manner. Depending on a respective type of fabrication of the depression insulation layer VI and respective dimensions of the field-effect transistor, the source and drain depressions may have a depth of approximately 50 to 300 nm. In this case, the electrical properties of the field-effect transistor can be set very accurately particularly in the case of perpendicular sidewalls of the depressions SV and DV.

Silicon dioxide, for example, is used as the gate dielectric, but other dielectric layers can also be used. Amorphous silicon or polysilicon is preferably used as the gate layer 4, but metal gates or other materials can also be used. In particular, for the gate stack G, it is also possible to realize other layer structures as are known for example from the field of non-volatile memory elements (flash EPROM, $E^2$PROM, etc.).

Figure 2:
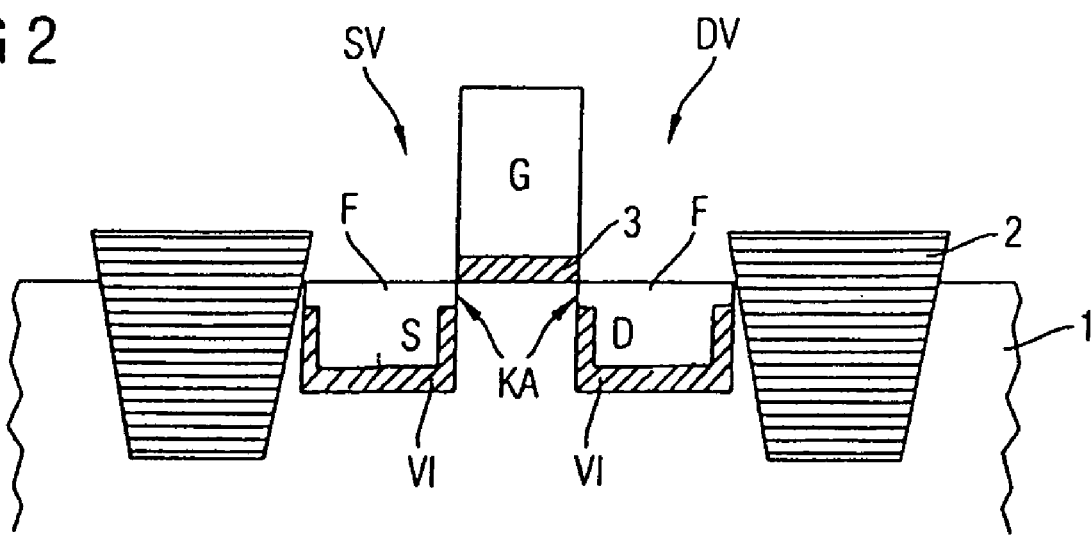
FIG. 2 shows a simplified sectional view of a field-effect transistor with local source/drain insulation in accordance with a second exemplary embodiment.

FIG. 2 shows a simplified sectional view of a field-effect transistor with local source/drain insulation in accordance with a second exemplary embodiment, identical reference symbols designating elements or layers identical or corresponding to those in FIG. 1 and a repeated description being dispensed with below.

In the exemplary embodiment in accordance with FIG. 2, the depression insulation layer VI has not only a depression bottom insulation layer formed in the bottom region of the source and drain depressions SV and DV, but moreover a depression sidewall insulation layer, which, however, does not touch the gate dielectric 3 and thus enables a defined channel connection region KA for the connection of a channel region lying below the gate dielectric 3. This results in channel connection regions KA which have very low leakage currents and further reduced junction capacitances. It is thus possible to avoid the methods usually used for forming such shallow connection regions by means of shallow implantations, pre-amorphization or defect implantations and also short RTP annealing steps (rapid thermal process). The fact that the dimensions of the source and drain depressions can be set very accurately means that the electrical properties of the field-effect transistors formed therewith can also be defined very accurately, thus resulting in semiconductor components with significantly reduced junction capacitances.

When polysilicon is used as the filling layer F, the extension or connection regions KA may be realized by means of outdiffusion, thereby producing dopant profiles with a maximum gradient.

FIGS. 3A to 3I show simplified sectional views for illustrating essential method steps in the fabrication of a field-effect transistor with local source/drain insulation, once again identical reference symbols designating layers or elements identical or similar to those in FIGS. 1 and 2 and a repeated description being dispensed with below.

Figure 3A:
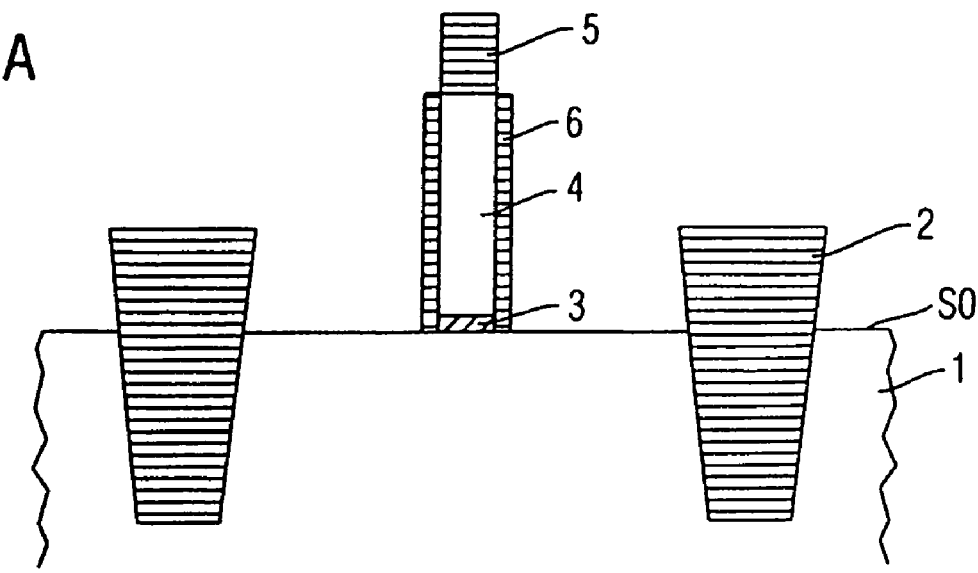
FIGS. 3A to 3I show simplified sectional views for illustrating essential method steps in the fabrication of a field-effect transistor with local source/drain insulation in accordance with a third exemplary embodiment.

In accordance with FIG. 3A, firstly in a preparatory method, a gate stack with a gate layer 4 and a gate dielectric 3 is formed on a semiconductor substrate 1. In the case of such a method, usually referred to as a gate process, firstly a pad oxide (not illustrated) is deposited at the surface of the semiconductor substrate 1 and a pad nitride (not illustrated) is subsequently formed at the surface of the pad oxide. Afterward, a shallow trench isolation 2 is formed in the semiconductor substrate 1 by means of a conventional STI method (shallow trench isolation) and then at least the pad nitride layer is removed again. One or more implantations are subsequently effected for forming well and/or channel doping regions in the semiconductor substrate 1, it also being possible to realize a multiple well construction depending on the semiconductor circuit to be formed. Afterward, preferably a thermal oxidation of the substrate surface SO is effected in order to form the gate dielectric 3, as a result of which e.g. a high-quality gate oxide is formed. Afterward, by way of example, a deposition of polysilicon with a thickness of 100 nm, for example, is effected in order to form the gate layer 4 and, by way of example, a TEOS insulation layer with a thickness of approximately 50 nm is deposited at the surface thereof in order to form a hard mask layer 5. Afterward, for the patterning of at least the gate layer 4, a photolithographic method is firstly applied to the hard mask layer 5, the gate layer 4 subsequently being patterned using the patterned hard mask layer 5, preferably by means of an anisotropic etching method (RIE, reactive ion etching). Finally, a further thermal oxidation or oxide deposition may be carried out for forming a gate sidewall insulation layer 6 at the sidewalls of the gate layer 4, as a result of which a protection layer having a thickness of approximately 6 nm is obtained. In this case, the gate sidewall insulation layer 6 serves as an etching stop layer for later etching steps and also as a lateral protection layer for the relatively sensitive gate dielectric 3.

The sectional view illustrated in FIG. 3A is obtained in this way, it also being possible to carry out alternative methods for forming and patterning a gate stack with a gate layer 4 and a gate dielectric 3 on a semiconductor substrate 1.

Afterward, source and drain depressions are formed in the semiconductor substrate 1 at the gate stack.

Figure 3B:
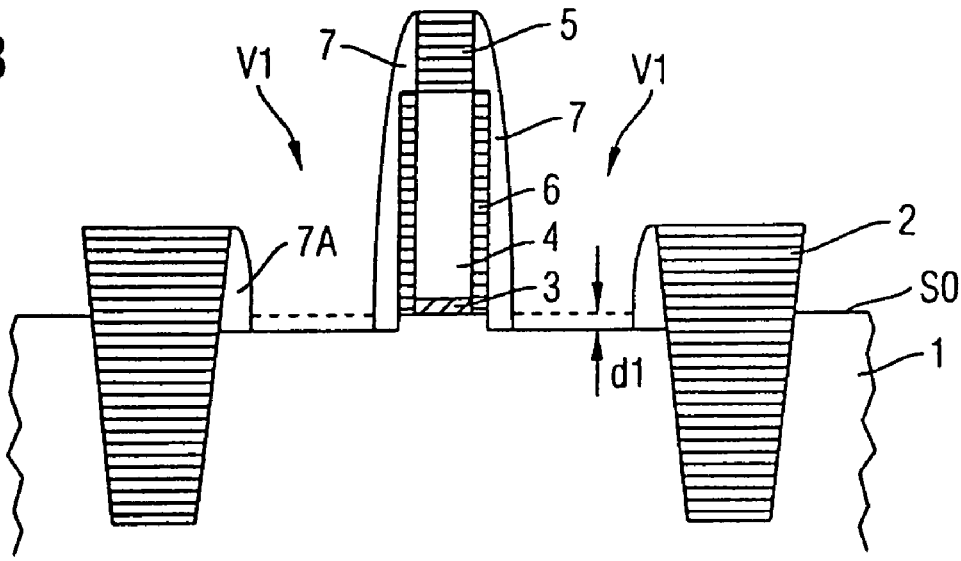

In accordance with FIG. 3B, it is possible, by way of example, firstly to form first depressions V1 for realizing channel connection regions KA in the semiconductor substrate 1, a cutout having a depth of d1=10 to 50 nm being formed preferably by means of an anisotropic etching method such as e.g. RIE (reactive ion etching) or alternatively by wet-chemical means. In this case, the depth of this first depression V1 serves as an optimization parameter for the fabrication of the extension or channel connection region.

At this point in time it is possible, optionally, to form a first thin semiconductor protection layer (not illustrated) at least in the region of the channel connection region KA and preferably over the whole area, in order to protect the semiconductor surface (silicon) from a subsequent nitride deposition, which is generally problematic for silicon semiconductor materials. Accordingly, this first semiconductor protection layer preferably comprises a silicon oxide layer.

Afterward, in accordance with FIG. 3B, spacers 7 are formed at the gate stack, the gate stack essentially being composed of the gate dielectric 3, the gate layer 4, the hard mask layer 5 and the gate sidewall insulation layer 6 (possibly present). The spacers 7 are preferably formed by conformal, i.e. uniformly thick, deposition of silicon nitride on the available surface and subsequent anisotropic etching-back, an LPCVD method (low pressure chemical vapor deposition), for example, being used for the deposition. Once again, the thickness of the spacers 7 is also an optimization parameter for the channel connection region KA, preferably spacer thicknesses of approximately 10 to 30 nm yielding particularly favorable connection properties.

The first depressions V1 are preferably formed using the gate stack and the shallow trench isolation 2 as a mask, thus essentially resulting in self-aligning methods for a first depression V1.

Figure 3C:
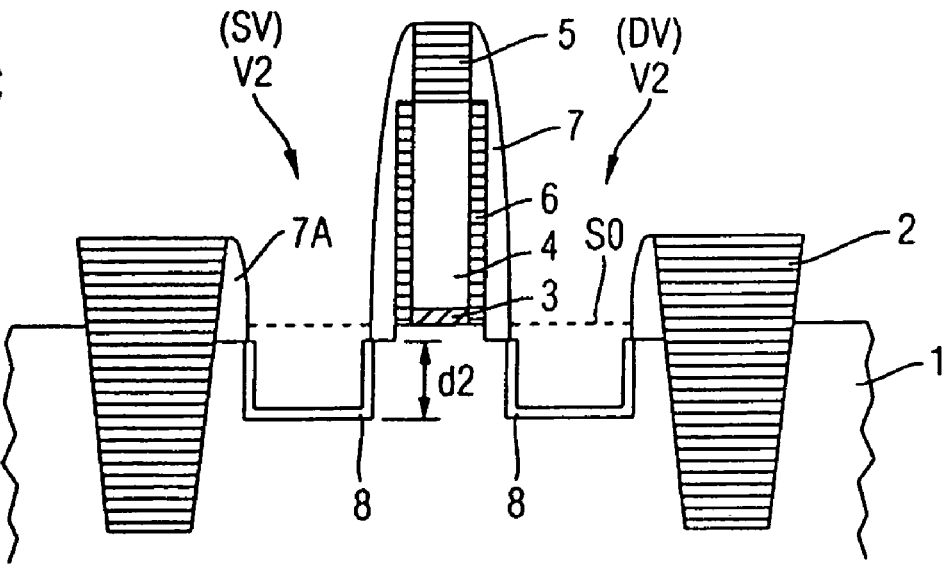

In accordance with FIG. 3C, second depressions V2 are then formed within the first depressions V1 in the semiconductor substrate 1 using the spacers 7 formed at the gate stack and also the further spacers 7A formed at the shallow trench isolation 2 as a mask. More precisely, a second depression V2 having a depth d2 of approximately 40 to 250 nm is formed by means of a silicon RIE method, for example, thus yielding a total depth for the source and drain depressions SV and DV of d1+d2=approximately 50 to 300 nm, measured from the substrate surface SO.

Finally, in order to form a depression insulation layer at least in a bottom region of the source and drain depressions SV and DV, firstly an insulation mask layer 8 is formed. In this case, the exposed semiconductor material or silicon is preferably nitrided with NH$_3$ within a temperature range of 600 to 900° C. As an alternative, however, it is also possible to carry out a nitride deposition for realizing the insulation mask layer 8. The silicon nitride thickness sought, or thickness of the insulation mask layer 8, is approximately 1 to 5 nm, for example. In principle, an additional thin oxide buffer layer (not illustrated) may again be produced below the deposited nitride for the protection of the semiconductor material.

Figure 3D:
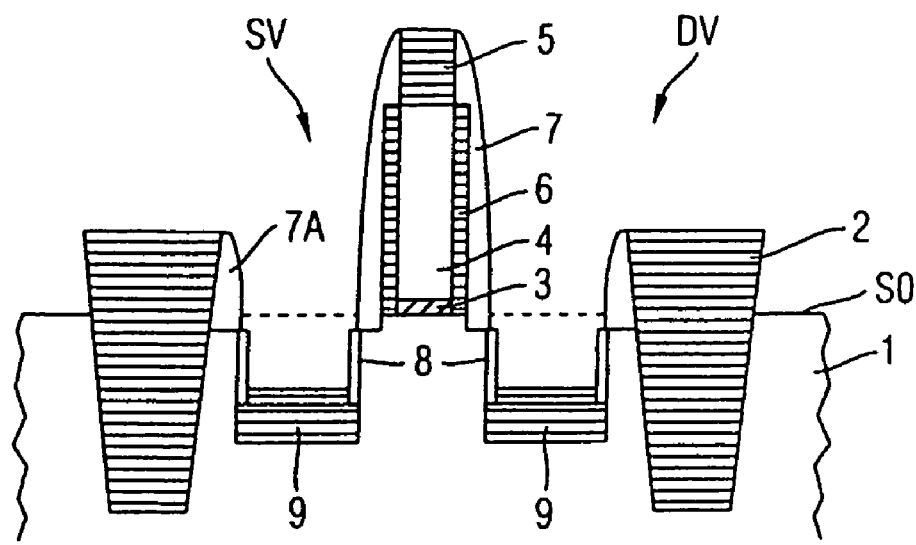

In accordance with FIG. 3D, in a subsequent step, the insulation mask layer 8 is removed at least in the bottom region of the source and drain depressions SV and DV, preferably an anisotropic etching method and in particular an RIE nitride etching method being carried out for uncovering the bottom regions. In the case of a whole-area deposition of the insulation mask layer 8, only the horizontal areas are uncovered in this case. Afterward, a depression bottom insulation layer 9 is formed in each case in the uncovered bottom regions of the source and drain depressions SV and DV, a thermal oxidation, for example, being carried out on the uncovered semiconductor material. This results in the formation of, by way of example, a silicon oxide layer with a thickness of 20 to 40 nm in the bottom region of the source and drain depressions.

As an alternative to thermal oxidation, it is also possible to carry out a so-called SELOX method (selective oxide deposition process) for the selective deposition of an insulating layer only in the bottom region of the source and drain depressions SV and DV. Accordingly, the depths for the source and drain depressions are to be chosen depending on a fabrication method respectively selected for the depression bottom insulation layer 9. With regard to the further technical details of the SELOX method, in particular, reference is made in particular to the literature reference N. Elbel, et al., "A new STI-process based on selective oxide deposition" at Symposium on VLSI-Technology 1998.

Accordingly, the insulation mask layer 8 not only allows the horizontal and vertical areas to be oxidized separately, but furthermore reduces the mechanical stress in the channel region.

Figure 3E:
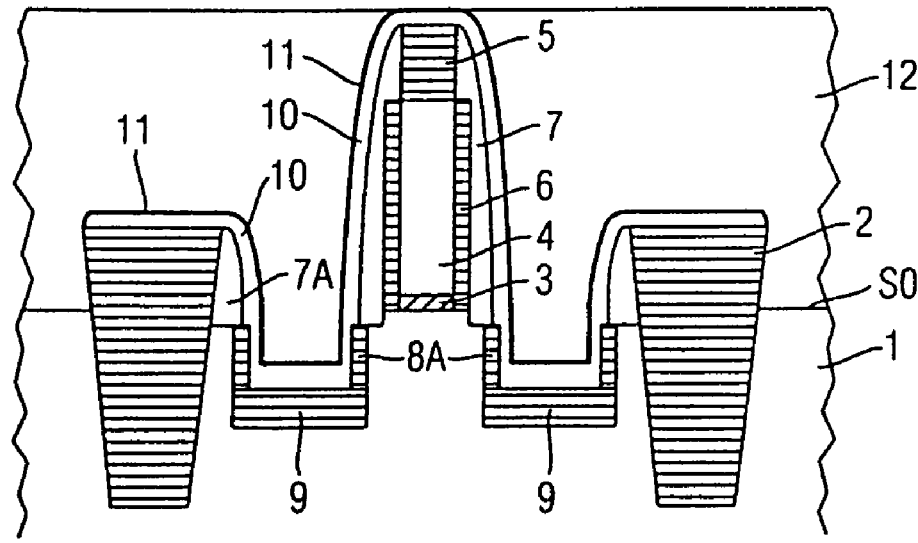

In accordance with FIG. 3E, furthermore, it is optionally possible also to remove the remaining insulation mask layer 8 at the sidewalls of the source and drain depressions SV and DV and to form depression sidewall insulation layers 8A in the uncovered sidewall regions of the depressions. More precisely, in order to remove the thin nitride layer 8 at the sidewalls, a brief etching step is carried out and then a thermal oxidation at a temperature of approximately 800° C. or a wet oxidation is carried out in order to fabricate a depression sidewall insulation layer 8A having a thickness of approximately 5 to 20 nm. The depression bottom insulation layer 9 and also the depression sidewall insulation layer 8A are preferably formed as silicon dioxide layers.

Afterward, the at least partially insulated source and drain depressions SV and DV are then filled with a filling layer, preferably firstly a seed layer 10 being formed for realizing a later selective deposition of polysilicon. By way of example, a thin doped or undoped amorphous or polycrystalline semiconductor layer is deposited, silicon or SiGe preferably being used, although alternative materials may also be used as the seed layer 10. Afterward, in order to form a seed protection layer 11, the seed layer 10 is briefly oxidized or nitrided and, finally, a seed mask layer 12 is formed, a resist deposition preferably being carried out over the whole area. The sectional view illustrated in FIG. 3E is obtained after the seed mask layer 12 has been planarized by means of, by way of example, a chemical mechanical polishing method (CMP) using the seed protection layer 11 as a stop layer.

Figure 3F:
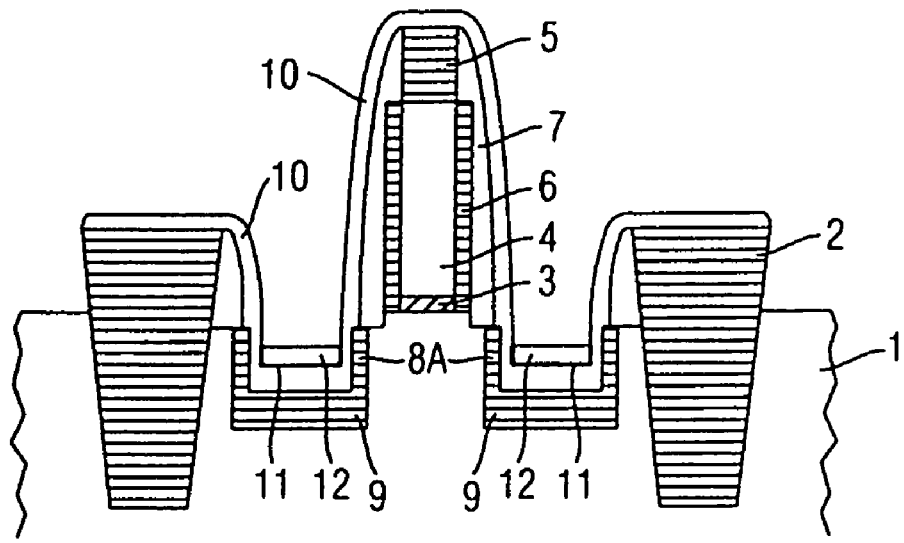

In accordance with FIG. 3F, the seed mask layer 12 is subsequently caused to recede right into the source and drain depressions SV and DV, a resist etching being carried out after a predetermined time, by way of example. Such a receding process can be carried out relatively accurately since the height of the gate stack is usually known very accurately. Using the seed mask layer 12 that has been caused to recede right into the source and drain depressions, the seed protection layer 11 is then partially removed, i.e. the oxide and/or nitride layer are removed except for the region covered by the seed mask layer 12. The seed mask layer 12 that was caused to recede is subsequently removed, resist stripping preferably being carried out.

Figure 3G:
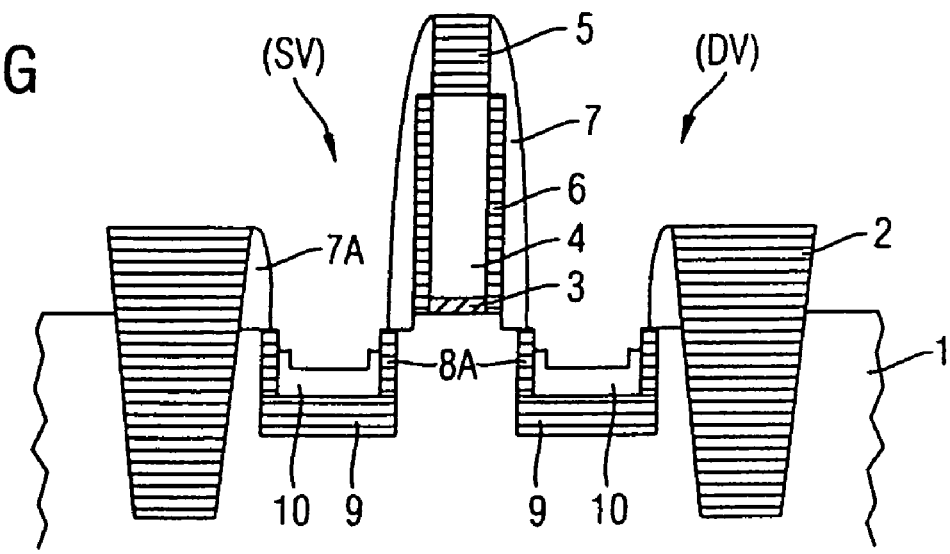

In accordance with FIG. 3G, afterward, the seed layer 10 is then partially removed using the seed protection layer 11 remaining in the source and drain depressions SV and DV as a mask, a wet-chemical silicon etching method being carried out, by way of example. Finally, the residual seed protection layer 11 is also completely removed. A nitride and/or an oxide etching method is again carried out for removing the seed protection layer 11.

The amorphous or polycrystalline seed layer 10 remaining in the source and drain depressions SV and DV then allows a selective deposition or a growth of semiconductor material on said layer, the rest of the regions, which are covered by oxide, remaining free of said growth layer 13.

Figure 3H:
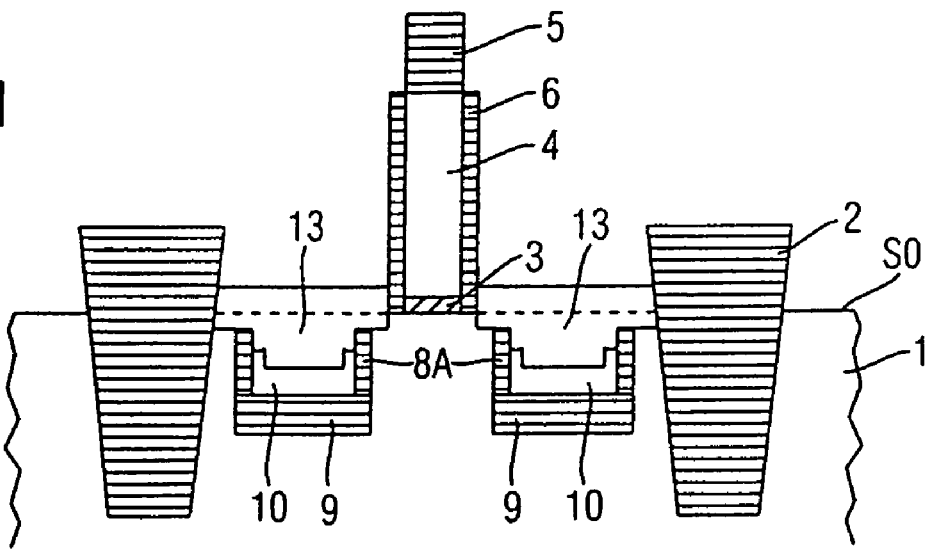

In accordance with FIG. 3H, firstly the spacers 7 at the gate stack and also the spacers 7A at the shallow trench isolation 2 are removed in order to uncover the channel connection regions KA. This is preferably carried out by means of a wet-chemical nitride etching.

It is optionally possible, in order to prevent grain formation during a subsequent growth process in the channel connection region, to form a very thin interface layer (not illustrated) made, for example, of silicon dioxide or silicon nitride. The growth layer 13 is subsequently formed on the seed layer 10 right into a region of the substrate surface SO, in particular doped or undoped amorphous or polycrystalline semiconductor material being deposited selectively (with respect to silicon dioxide) up to a thickness of approximately 50 to 400 nm. In particular, the various process conditions for the deposition of amorphous or polycrystalline silicon on different substrates are utilized during this step. A so-called "raised source/drain" structure is thus produced.

Figure 3I:
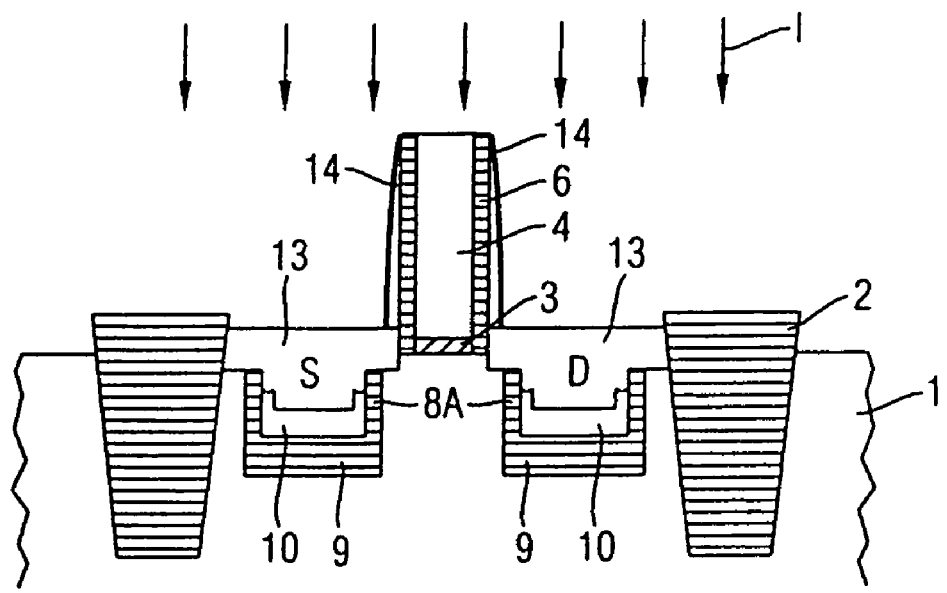

In accordance with FIG. 3I, in a subsequent step, implantation spacers 14 are formed at the sidewalls of the gate stack or the gate sidewall insulation layer 6. Said implantation spacers 14 preferably again comprise a silicon nitride layer. Afterward, the hard mask layer 5 can be removed using an oxide etching, the trench isolations 2 and the TEOS hard mask layer being caused to recede, but the gate sidewall insulation layers 6 are protected by the implantation spacers 14. Finally, an implantation I of dopants is effected for doping the uncovered gate layer 4 and also the growth layer 13 and, if appropriate, the seed layer 10. This implantation is effected as usual by means of resist mask technology, it being possible furthermore to carry out a thermal annealing step in order to activate the dopants.

The connections of source and drain are then effected by means of outdiffusion from these highly doped polysilicon layers, the doped polycrystalline or amorphous semiconductor material acting like an infinite dopant source owing to the high diffusion constant along the grain boundaries. The resulting advantages are very steep diffusion flanks and high dopings. Since the implantation I of the source and drain regions S and D takes place directly into the amorphous or polycrystalline semiconductor material, the underdiffusion of the channel connection regions KA is not determined by implantation defects since the latter recombine at the polysilicon grain boundaries. Owing to this fact, it is possible to use larger temperature budgets in order to achieve better process control and higher activation of the dopants.

As an alternative to the deposition of undoped semiconductor material or silicon, it is also possible to deposit in situ-doped semiconductor material. For this purpose, the wafer is covered with a mask layer and the region for e.g. NFET transistors is then opened selectively. Doped semiconductor material is then deposited only in this region. The process is repeated correspondingly for PFET transistors.

Figure 4:
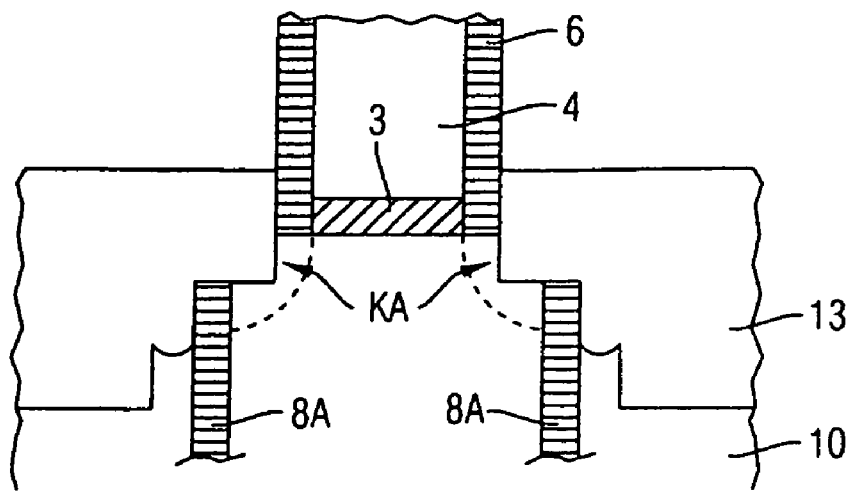
FIG. 4 shows a partly enlarged sectional view of a field-effect transistor in accordance with the third exemplary embodiment.

FIG. 4 shows a simplified partial sectional view for illustrating the channel connection regions when using undoped or doped semiconductor material in accordance with the third exemplary embodiment described above.

Figure 5A:
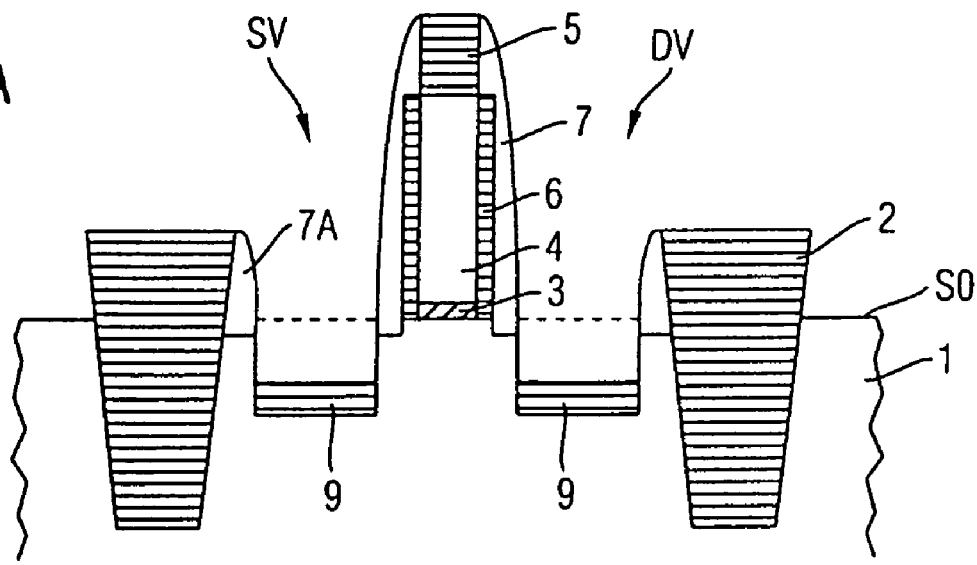
FIGS. 5A and 5B show simplified sectional views for illustrating essential method steps in the fabrication of a field-effect transistor with local source/drain insulation in accordance with a fourth exemplary embodiment.
Figure 5B:
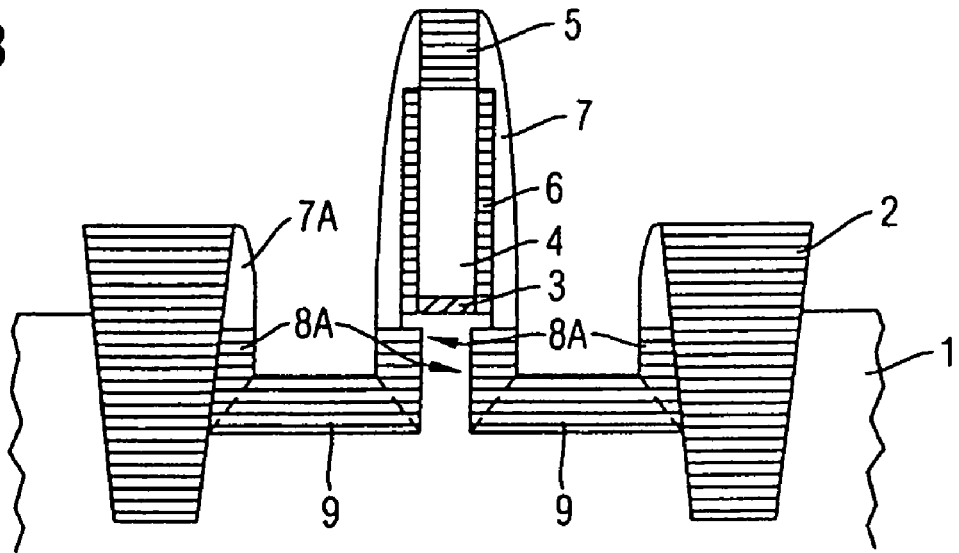

FIGS. 5A and 5B show simplified sectional views of essential method steps in the fabrication of a field-effect transistor with local source/drain insulation in accordance with a fourth exemplary embodiment, identical reference symbols designating elements or layers identical or corresponding to those in FIGS. 1 to 4 and a repeated description being dispensed with below.

In accordance with the present fourth exemplary embodiment, a description is given of so-called field-effect transistors with "fully depleted" channel regions. Field-effect transistors of this type are desirable particularly when realizing fast short-channel transistors, since significantly increased speeds and clock frequencies can be realized as a result.

In this case, FIGS. 5A and 5B correspond to the method steps in accordance with 3D and 3E, a depression sidewall insulation layer 8A which extends far into a region below the gate dielectric 3 being formed in order to realize the fully depleted channel regions. More precisely, a large thickness of the depression sidewall insulation layer 8A, lying in a range of 20 to 30 nm, is produced for example by means of oxidation of the uncovered sidewalls of the source and drain depressions SV and DV. This high thickness produces a pinch-off of the so-called body or channel region, thus resulting in a fully depleted structure in the channel region.

The advantages of a field-effect transistor of this type, particularly when realizing circuits with transistors of different channel lengths, are that the transistors with a short channel length have the fully depleted structures illustrated in FIG. 5B with their associated power advantages, as are also known from SOI semiconductor circuits, while the transistors with a large channel length, as are also used for mixed-signal circuits, furthermore exhibit the behavior of bulk transistors and, accordingly, in a customary manner, have a well connection for defining a potential in the channel region. Accordingly, it is possible in this way to fabricate quasi-SOI transistors and so-called bulk transistors simultaneously on one chip without using additional masks as it were in a self-aligning or automatic manner. This means, in particular, an advantage for SoC circuits, where fast digital circuits and mixed-signal circuits are to be realized on one chip.

The invention as been described above on the basis of silicon semiconductor circuits. However, it is not restricted thereto and also encompasses in the same way semiconductor circuits with alternative semiconductor materials. In the same way, alternative materials can also be used in particular for the gate layer and the filling layer.

The invention claimed is:

1. A field-effect transistor with local source-drain insulation, having
    a semiconductor substrate;
    a source depression and a drain depression, which are formed in a manner spaced apart from one another in the semiconductor substrate, wherein the source and drain depressions have, in an upper region, a widening with a predetermined depth for realizing defined channel connection regions;
    a depression insulation layer, which is formed at least in a bottom region of the source depression and of the drain depression, wherein the depression insulation layer has a depression sidewall insulation layer, which is formed in a sidewall region of the source and drain depressions but does not touch the gate dielectric; and
    an electrically conductive filling layer, which is formed for realizing source and drain regions and for filling the source and drain depressions at a surface of the depression insulation layer, wherein the electrically conductive filling layer has a seed layer for improving a deposition in the source and drain depressions, the seed layer comprising silicon or SiGe;

a gate dielectric, which is formed at a substrate surface between the source and drain depressions; and a gate electrode layer, which is formed at a surface of the gate dielectric, wherein the depression sidewall insulation layer extends into a region below the gate dielectric and overlaps with the gate electrode layer and the gate dielectric.

2. The field-effect transistor as claimed in claim 1, wherein a gate insulation layer is formed at sidewalls of the gate electrode layer.

3. The field-effect transistor as claimed in claim 1, wherein the field-effect transistor is bounded by shallow trench isolations.

4. The field-effect transistor as claimed in claim 1, wherein the field-effect transistor has lateral structures <100 nm.

5. The field-effect transistor as claimed in claim 1, wherein the source and drain depressions have a depth of approximately 50 nm to 300 nm.

6. The field effect transistor as claimed in claim 1, wherein the source and drain depressions form a step at the widening.

7. The field effect transistor as claimed in claim 1, wherein the widening is filled with a first material different from a second material of the seed layer.

* * * * *

UNITED STATES PATENT AND TRADEMARK OFFICE
CERTIFICATE OF CORRECTION

PATENT NO. : 7,528,453 B2  Page 1 of 1
APPLICATION NO. : 10/530634
DATED : May 5, 2009
INVENTOR(S) : Holz et al.

It is certified that error appears in the above-identified patent and that said Letters Patent is hereby corrected as shown below:

On the Title Page

Item (57), line 11, under "ABSTRACT", after "The gate layer" replace "(is" with --is--.

Item (57), line 13, under "ABSTRACT", after "with a predetermined" replace "death" with --depth--.

Signed and Sealed this

Sixteenth Day of March, 2010

David J. Kappos
*Director of the United States Patent and Trademark Office*